United States Patent
Konagai

(10) Patent No.: US 9,053,783 B2
(45) Date of Patent: Jun. 9, 2015

(54) NONVOLATILE SEMICONDUCTOR MEMORY DEVICE

(75) Inventor: Satoshi Konagai, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 509 days.

(21) Appl. No.: 13/422,417

(22) Filed: Mar. 16, 2012

(65) Prior Publication Data

US 2012/0241716 A1 Sep. 27, 2012

(30) Foreign Application Priority Data

Mar. 24, 2011 (JP) ................................. 2011-066672

(51) Int. Cl.
*H01L 45/00* (2006.01)
*G11C 13/00* (2006.01)
*H01L 27/24* (2006.01)

(52) U.S. Cl.
CPC ............ *G11C 13/0007* (2013.01); *H01L 45/04* (2013.01); *H01L 45/145* (2013.01); *H01L 45/1666* (2013.01); *H01L 27/2409* (2013.01); *H01L 27/2481* (2013.01); *G11C 2213/35* (2013.01)

(58) Field of Classification Search
USPC .................. 365/148, 163; 257/5, 296, 2, 3, 4; 438/102, 103, 104
See application file for complete search history.

(56) References Cited

U.S. PATENT DOCUMENTS

| | | | |
|---|---|---|---|
| 6,689,644 B2 * | 2/2004 | Johnson ........................ | 438/131 |
| 7,507,674 B2 * | 3/2009 | Park et al. ..................... | 438/724 |
| 7,646,630 B2 * | 1/2010 | Lowrey et al. ................. | 365/163 |
| 7,964,869 B2 * | 6/2011 | Muraoka et al. ................ | 257/43 |
| 8,107,303 B2 | 1/2012 | Saito | |
| 8,187,918 B2 * | 5/2012 | Oh et al. ....................... | 438/102 |
| 8,208,282 B2 * | 6/2012 | Johnson et al. ............... | 365/115 |
| 8,441,060 B2 * | 5/2013 | Ninomiya et al. ............. | 257/324 |
| 8,455,346 B2 * | 6/2013 | Nojiri et al. .................... | 438/618 |

(Continued)

FOREIGN PATENT DOCUMENTS

| | | |
|---|---|---|
| JP | 2009-43942 | 2/2009 |
| JP | 2009-239148 | 10/2009 |

(Continued)

OTHER PUBLICATIONS

Japanese Office Action issued Sep. 3, 2013, in Japan Patent Application No. 2011-066672 (with English translation).

(Continued)

*Primary Examiner* — Bradley K Smith
*Assistant Examiner* — David Goodwin
(74) *Attorney, Agent, or Firm* — Oblon, McClelland, Maier & Neustadt, L.L.P.

(57) ABSTRACT

According to one embodiment, in a nonvolatile semiconductor memory device, a first line is disposed on a semiconductor substrate. A first memory cell is disposed on a side opposite to the semiconductor substrate with respect to the first line. A second line intersects with the first line via the first memory cell. A second memory cell is disposed on a side opposite to the semiconductor substrate with respect to the second line. A third line intersects with the second line via the second memory cell. The first memory cell has a first resistance change layer and a first rectification layer. The second memory cell has a second resistance change layer and a second rectification layer. A composition of the first resistance change layer is different from a composition of the second resistance change layer.

11 Claims, 12 Drawing Sheets

(56) References Cited

U.S. PATENT DOCUMENTS

| | | |
|---|---|---|
| 8,658,997 B2 * | 2/2014 | Chiang ............................. 257/2 |
| 2004/0057180 A1 * | 3/2004 | Pashmakov ..................... 361/90 |
| 2005/0162881 A1 * | 7/2005 | Stasiak et al. ................... 365/63 |
| 2006/0110877 A1 * | 5/2006 | Park et al. ..................... 438/238 |
| 2010/0046285 A1 * | 2/2010 | Lung ............................. 365/163 |
| 2010/0054014 A1 * | 3/2010 | Lee et al. ...................... 365/148 |
| 2010/0193757 A1 | 8/2010 | Suga et al. |
| 2010/0237311 A1 | 9/2010 | Okajima |
| 2010/0237319 A1 | 9/2010 | Satoh et al. |
| 2010/0308298 A1 * | 12/2010 | Ninomiya et al. ................ 257/5 |
| 2011/0001112 A1 * | 1/2011 | Kiyotoshi ......................... 257/3 |
| 2012/0181599 A1 * | 7/2012 | Lung ............................. 257/324 |
| 2013/0168634 A1 * | 7/2013 | Lee ................................... 257/4 |

FOREIGN PATENT DOCUMENTS

| | | |
|---|---|---|
| JP | 2009-267384 A | 11/2009 |
| JP | 2010-62418 | 3/2010 |
| JP | 2010-219282 | 9/2010 |

OTHER PUBLICATIONS

Office Action issued Jun. 11, 2013, in Japanese patent Application No. 2011-066672 with English translation.

* cited by examiner

FIG. 8
DR CHARACTERISTICS DEPENDING ON COMPOSITION OF FILM
| | METAL OXIDE | FIRST CARBON-BASED MATERIAL | SECOND CARBON-BASED MATERIAL |
|---|---|---|---|
| DR CHARACTERISTICS | 2.2 σ | 2.3 σ | 2.6 σ |
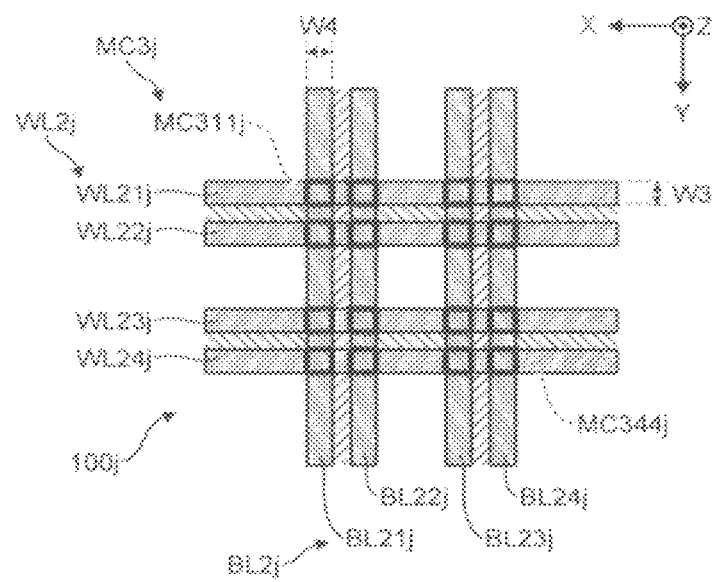
FIG. 9A
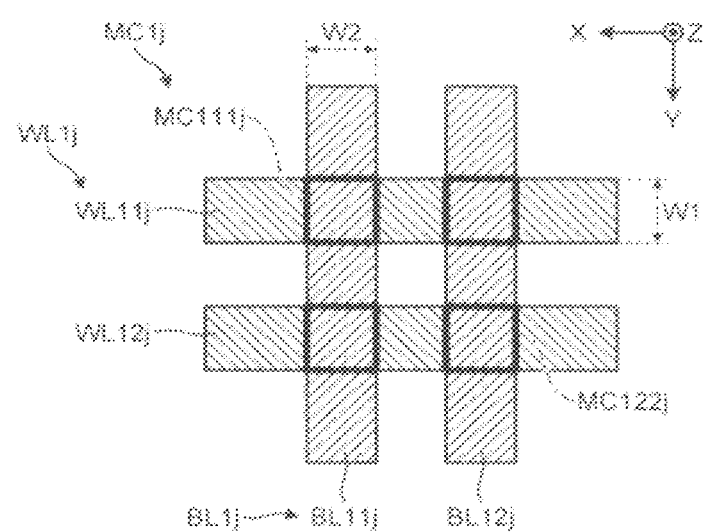
FIG. 9B

NONVOLATILE SEMICONDUCTOR MEMORY DEVICE

CROSS-REFERENCE TO RELATED APPLICATIONS

This application is based upon and claims the benefit of priority from Japanese Patent Application No. 2011-066672, filed on Mar. 24, 2011; the entire contents of which are incorporated herein by reference.

FIELD

Embodiments described herein relate generally to a nonvolatile semiconductor memory device.

BACKGROUND

In recent years, there has been a demand for a nonvolatile memory which does not depend on transistor operation. As the nonvolatile memory, since a resistance change memory such as a phase change memory (PCM) element and a resistance RAM (ReRAM) element utilizes a resistance change state of a resistance material for operation, the transistor operation is unnecessary for write/erase. Also, write/erase speed is lowered or a write/erase current is increased due to difficulty in completely changing a resistance of the resistance change material in the case where the size of the resistance material is large (100 nm to 1 μm), but it is easy to completely change the resistance of the resistance change material by miniaturizing the size of the resistance material. Therefore, the resistance change memory has the characteristics that element properties are improved along with the miniaturization to thereby realize write/erase speed improvement and power consumption reduction. Also, the resistance change memory having a multilayer structure has the advantage that a bit density thereof is relatively easily increased. Therefore, along with an increase in semiconductor products which require high capacity data processing, there is an increasing need for the resistance change memory.

BRIEF DESCRIPTION OF THE DRAWINGS

FIG. 8 is a diagram showing a relationship between a composition of a resistance change layer and data retention according to the second embodiment;

FIGS. 9A and 9B are diagrams showing a configuration of a nonvolatile semiconductor memory device according to a third embodiment;

DETAILED DESCRIPTION

In general, according to one embodiment, there is provided a nonvolatile semiconductor memory device including a semiconductor substrate, a first line, a first memory cell, a second line, a second memory cell, and a third line. The first line is disposed on the semiconductor substrate. The first memory cell is disposed on a side opposite to the semiconductor substrate with respect to the first line. The second line intersects with the first line via the first memory cell. The second memory cell is disposed on a side opposite to the semiconductor substrate with respect to the second line. The third line intersects with the second line via the second memory cell. The first memory cell has a first resistance change layer and a first rectification layer. The second memory cell has a second resistance change layer and a second rectification layer. A composition of the first resistance change layer is different from a composition of the second resistance change layer.

Exemplary embodiments of a nonvolatile semiconductor memory device will be explained below in detail with reference to the accompanying drawings. The present invention is not limited to the following embodiments.

(First Embodiment)

Figure 1A:
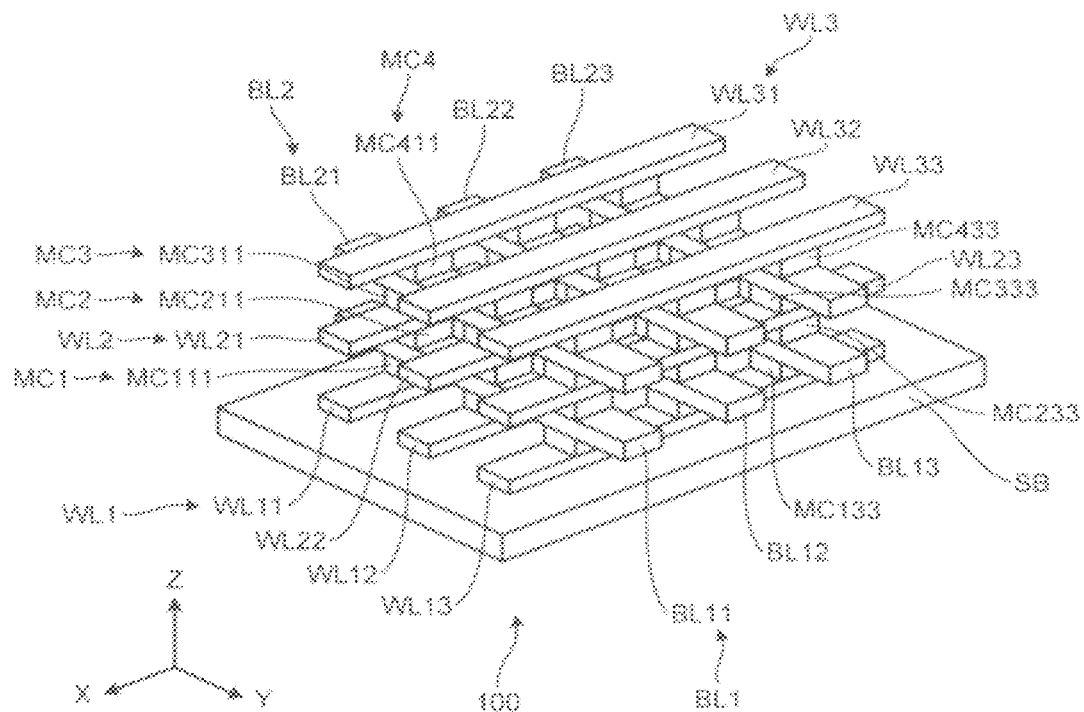
FIGS. 1A and 1B are diagrams showing a configuration of a nonvolatile semiconductor memory device according to a first embodiment.
Figure 1B:
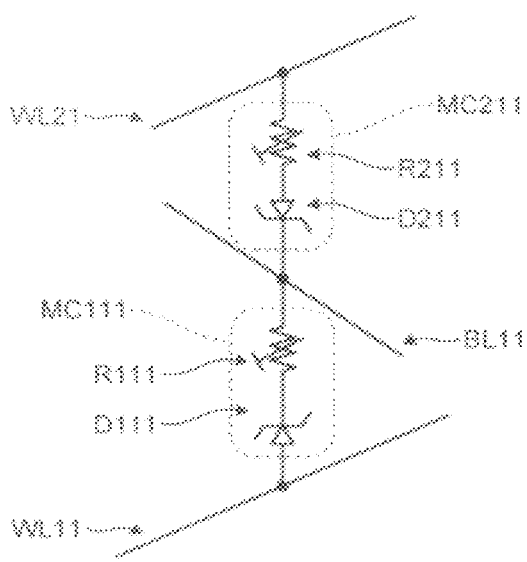

A nonvolatile semiconductor memory device 100 according to the first embodiment will be described by using FIGS. 1A and 1B. FIG. 1A is a perspective view schematically showing a configuration of the nonvolatile semiconductor memory device 100, and FIG. 1B is an equivalent circuit diagram of a portion including an upper memory cell and a lower memory cell in the nonvolatile semiconductor memory device.

In the nonvolatile semiconductor memory device 100, a wiring layer and a memory layer are alternately layered for plural times on a semiconductor substrate SB. For example, as shown in FIG. 1A, a wiring layer WL1, a memory layer MC1, a wiring layer BL1, a memory layer MC2, a wiring layer WL2, a memory layer MC3, a wiring layer BL2, a memory layer MC4, and a wiring layer WL3 are layered in a direction Z in this order. As used herein, "on the semiconductor substrate SB" is an expression including not only the case of being disposed directly on the semiconductor substrate SB but also the case of being disposed on the semiconductor substrate SB via a predetermined layer (e.g. interlayer insulation film or the like).

Each of the wiring layers WL1, WL2, WL3 extends in a direction X and has plural word lines aligned in a direction Y. For example, in the wiring layer WL1, the plural word lines WL11 to WL13 extend in the direction X and are aligned in the direction Y. For example, in the wiring layer WL2, the plural word lines WL21 to WL23 extend in the direction X and are aligned in the direction Y. In the wiring layer WL3, the plural word lines WL31 to WL33 extend in the direction X and are aligned in the direction Y.

Each of the wiring layers BL1 and BL2 extends in the direction Y and has plural bit lines aligned in the direction X. For example, in the wiring layer BL1, the plural bit lines BL 11 to BL 13 extend in the direction Y and are aligned in the direction X. For example, in the wiring layer BL2, the plural bit lines BL 21 to BL 23 extend in the direction Y and are aligned in the direction X.

Each of the memory layers MC1, MC2, MC 3, and MC4 is disposed between the wiring layer including the word lines and the wiring layer including the bit lines. For example, the memory layer MC1 is disposed between the wiring layer WL1 and the wiring layer BL1. For example, the memory layer MC2 is disposed between the wiring layer BL1 and the wiring layer WL2. For example, the memory layer MC3 is disposed between the wiring layer WL2 and the wiring layer BL2. For example, the memory layer MC4 is disposed between the wiring layer BL2 and the wiring layer WL3.

Also, each of the memory layers MC1, MC2, MC3, and MC4 has plural memory cells disposed at plural intersections between the plural word lines and the plural bit lines (i.e. disposed in matrix). For example, in the memory layer MC1, the plural memory cells MC111 to MC133 are disposed at plural intersections between the plural word liens WL11 to WL13 and the plural bit lines BL11 to BL13, i.e. disposed in matrix. For example, in the memory layer MC2, the plural memory cells MC211 to MC233 are disposed at plural intersections between the plural bit lines BL11 to BL13 and the plural word liens WL21 to WL23, i.e. disposed in matrix. For example, in the memory layer MC3, the plural memory cells MC311 to MC333 are disposed at plural intersections between the plural word liens WL21 to WL23 and the plural bit lines BL21 to BL23, i.e. disposed in matrix. For example, in the memory layer MC4, the plural memory cells MC411 to MC433 are disposed at plural intersections between the plural bit lines BL21 to BL23 and the plural word liens WL31 to WL33, i.e. disposed in matrix.

As viewed in the direction Z, for example, the memory cell MC111 is disposed on the word line WL11. The hit line BL11 intersects the word line WL11 via the memory cell MC111. The memory cell MC211 is disposed on the bit line BL11. The word line WL21 intersects the word line WL21 via the memory cell MC211. An equivalent circuit of this portion is shown in FIG. 1B.

As shown in FIG. 1B, in the memory cell MC111 (lower memory cell) disposed at the intersection between the word line WL11 and the bit line BL11, a rectification element D111 and a resistance change element R111 are serially connected. The rectification element D111 is a diode, for example, in which a cathode is connected to the resistance change element R111, and an anode is connected to the word line WL11. One end of the resistance change element R111 is connected to the bit line BL11, and the other end is connected to the rectification element D111.

Also, in the memory cell MC211 (upper memory cell) disposed at the intersection between the bit line BL11 and the word line WL21, a rectification element D211 and a resistance change element R211 are serially connected. The rectification element D211 is a diode, for example, in which a cathode is connected to the bit line BL11, and an anode is connected to the resistance change element R211. One end of the resistance change element R211 is connected to the word line WL21, and the other end is connected to the rectification element D211.

As described above, the nonvolatile semiconductor memory device 100 may be a resistance change memory of a crosspoint type, for example.

Though the configuration in which the direction from the word line to the bit line is a forward direction of the rectification elements D111, D211 is exemplified in FIG. 1B as a configuration of each of the memory cells MC111, MC211, a configuration in which the direction from the word line to the bit line is a backward direction of the rectification elements D111, D211 may be used. Also, in each of the memory cells MC111, MC211, the positions of the rectification element and the resistance change element may be interchanged with each other.

Figure 2A:
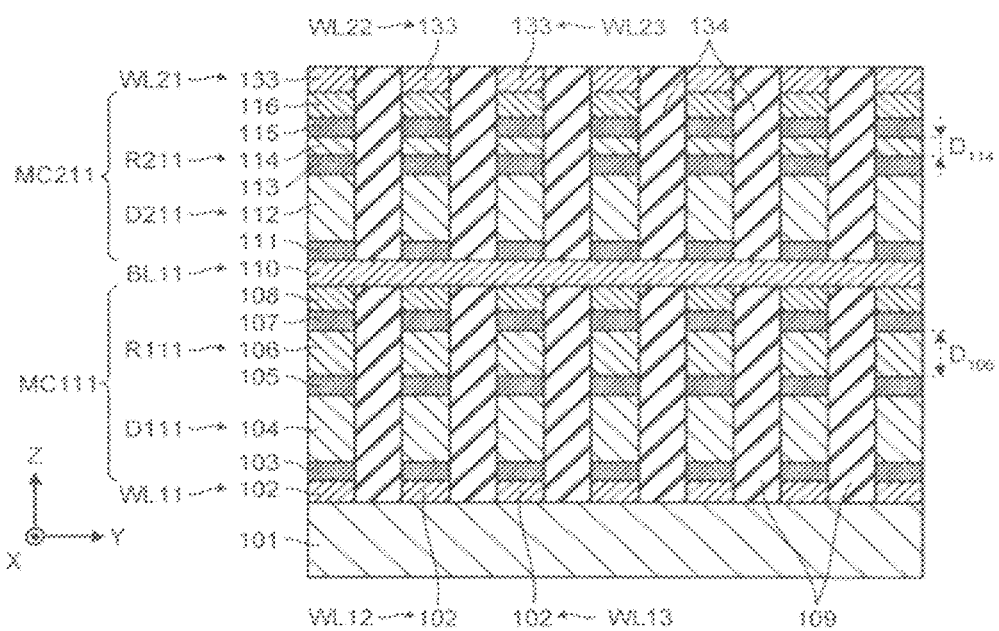
FIGS. 2A and 2B are diagrams showing the configuration of the nonvolatile semiconductor memory device according to the first embodiment.

Hereinafter, each of layer structures of the lower memory cell MC111 and the upper memory cell MC211 shown in FIG. 1B will be described by using FIGS. 2A and 2B. FIG. 2A is a diagram showing a sectional structure in the case where the nonvolatile semiconductor memory device 100 is cut along a plane which is perpendicular to the direction X, and FIG. 2A is a diagram showing a sectional structure in the case where the nonvolatile semiconductor memory device 100 is cut along a plane which is perpendicular to the direction Y.

Figure 2B:
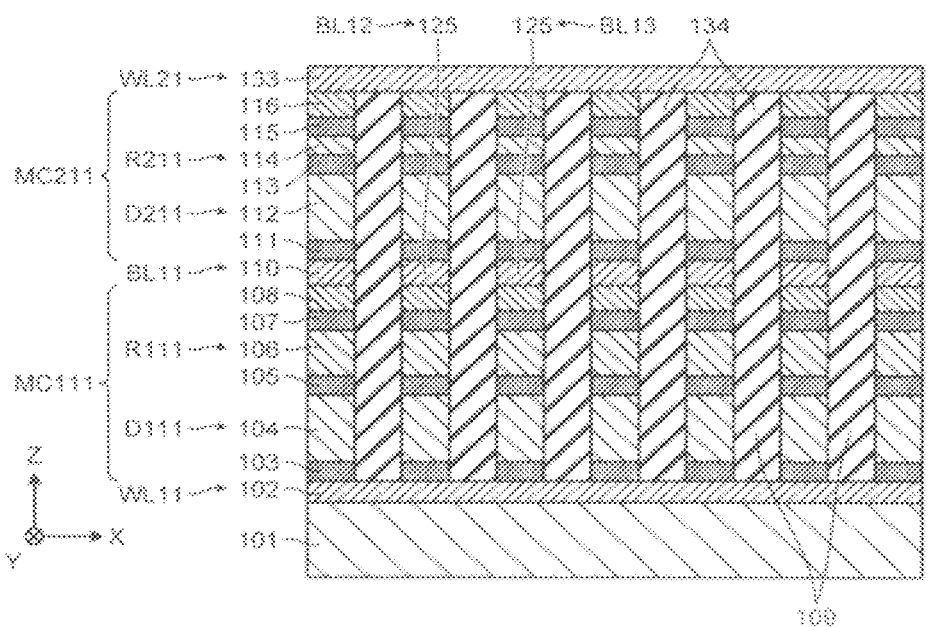

The lower memory cell MC111 shown in FIG. 1B is disposed at a position where a line pattern 102 corresponding to the word line WL11 and a line pattern 110 corresponding to the bit line BL11 intersect with each other as shown in FIGS. 2A and 2B. The memory cell MC111 is insulated from the adjacent memory cell in the same memory layer MC1 by an interlayer insulation film 109.

In the lower memory cell MC111, a barrier metal layer 103, a diode layer (rectification layer) 104, a lower electrode layer 105, a resistance change layer 106, an upper electrode layer 107, and a CMP stopper layer 108 are layered in this order.

The harrier metal layer 103 is disposed on the line pattern 102. The barrier metal layer 103 is formed from a conductor such as a metal (e.g. titanium nitride).

The diode layer 104 is disposed on the barrier metal layer 103. The diode layer 104 has a Metal-Insulator-Metal (MIM) structure, a P+poly Silicon-Intrinsic-N+poly Silicon (PIN) structure, or the like. In the case of the PIN structure, the diode layer 104 has a structure in which an N-type layer, an I-type layer, and a P-type layer are layered. The N-type layer is formed from a semiconductor (e.g. silicon) containing N-type impurities such as arsenic and phosphor. The I type layer is formed from a so-called intrinsic semiconductor (e.g. silicon) which does not contain any impurity. The P-type layer is formed from a semiconductor (e.g. silicon) containing P-type impurities such as boron. The diode layer 104 functions as the rectification element D111 in the memory cell MC111 (see FIG. 1B).

The lower electrode layer 105 is disposed on the diode layer 104. The lower electrode layer 105 is formed from a conductor such as a metal (e.g. titanium nitride). The lower electrode layer 105 functions as a lower electrode to the resistance change layer 106.

The resistance change layer 106 is disposed on the lower electrode layer 105. The resistance change layer 106 is formed from a material selected from the group consisting of $ZnMn_2O_4$, NiO, HfO, $TiO_2$, $SrZrO_3$, and $Pr_{0.7}Ca_{0.3}MnO_3$, for example. The resistance change layer 106 functions as the resistance change element 8111 in the memory cell MC111 (see FIG. 1B).

The upper electrode layer 107 is disposed on the resistance change layer 106. The upper electrode layer 107 is formed from a conductor such as a metal (e.g. titanium nitride). The upper electrode layer 107 functions as an upper electrode for the resistance change layer 106.

The CMP stopper layer 108 is disposed on the upper electrode layer 107. The CMP stopper layer 108 is formed from a conductor such as a metal (e.g. tungsten). The CMP stopper layer 108 functions as a stopper film when an upper surface is flattened in a production step as described later in this specification.

As shown in FIGS. 2A and 2B, the upper memory cell MC211 shown in FIG. 1B is disposed at a position where a line pattern 110 corresponding to the bit line BL11 and a line pattern 133 corresponding to the word line WL21 intersect with each other. Also, the memory cell MC211 is insulated from the adjacent memory cell in the same memory layer MC2 via an interlayer insulation film 134.

In the upper memory cell MC211, a barrier metal layer 111, a diode layer (rectification layer) 112, a lower electrode layer 113, a resistance change layer 114, an upper electrode layer 115, and a CMP stopper layer 116 are layered in this order.

Structures of the layers in the upper memory cell MC211 are basically the same as the lower memory cell MC111 and are different from the lower memory cell MC111 by the following features. A film thickness $D_{106}$ of the resistance change layer 106 in the lower memory cell MC111 is thicker than a film thickness $D_{114}$ of the resistance change layer 114 in the upper memory cell MC211. More specifically, the film thickness $D_{106}$ is thicker than the film thickness $D_{114}$ for being decided by considering that the number of heating processes performed for forming the diode layer in the lower memory cell MC111 is larger than that performed in the upper memory cell MC211. For example, the film thickness $D_{114}$ may be about 5 nm, and the film thickness $D_{106}$ may be about 10 nm.

The upper memory cell MC211 and the lower memory cell MC11 are disposed on a base film 101.

Hereinafter, a method for producing the nonvolatile semiconductor memory device 100 will be described by using FIGS. 3 to 5 and FIGS. 2A and 2B. FIGS. 3A to 5B are sectional views showing steps of the method for producing the nonvolatile semiconductor memory device 100. FIGS. 2A and 2B includes the diagrams showing sectional structures of the nonvolatile semiconductor memory 100 and are used as sectional views showing the steps of the production method.

Figure 3A:
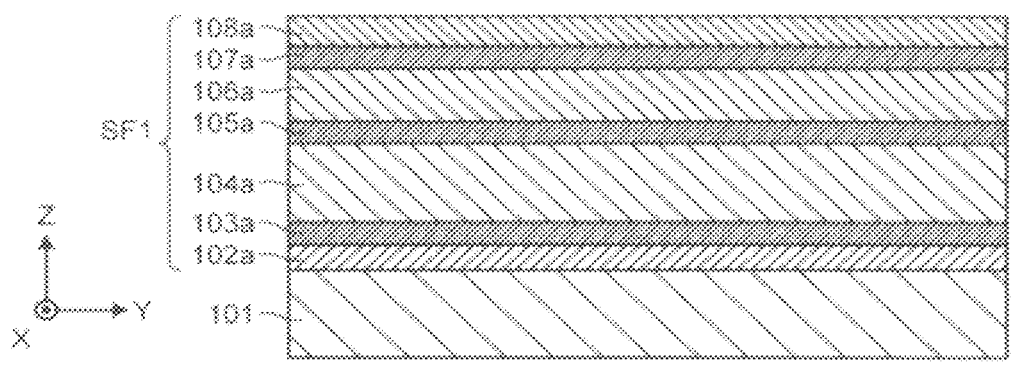
FIGS. 3A and 3B are diagrams showing a method for producing the nonvolatile semiconductor memory device according to the first embodiment.

In the step shown in FIG. 3A, on the base film 101 including the semiconductor substrate SB (or the semiconductor substrate SB and the interlayer insulation film formed thereon and the like), a stacked film SF1 in which a conduction layer 102a, a conduction layer 103a, a diode layer 104a, a conduction layer 105a, a resistance change layer 106a, a conduction layer 107a, and a CMP stopper layer 108a are layered in this order is formed.

For example, in the case where the diode layer 104a has the PIN structure, P-type impurities are introduced into a semiconductor layer which is to serve as a P-type layer in the diode layer 104a in-situ or after formation, and then a heat treatment for activating the P-type impurities is performed. Also, N-type impurities are introduced into a semiconductor layer which is to serve as an N-type layer in the diode layer 104a in-situ or after formation, and then a heat treatment for activating the N-type impurities is performed.

Figure 3B:
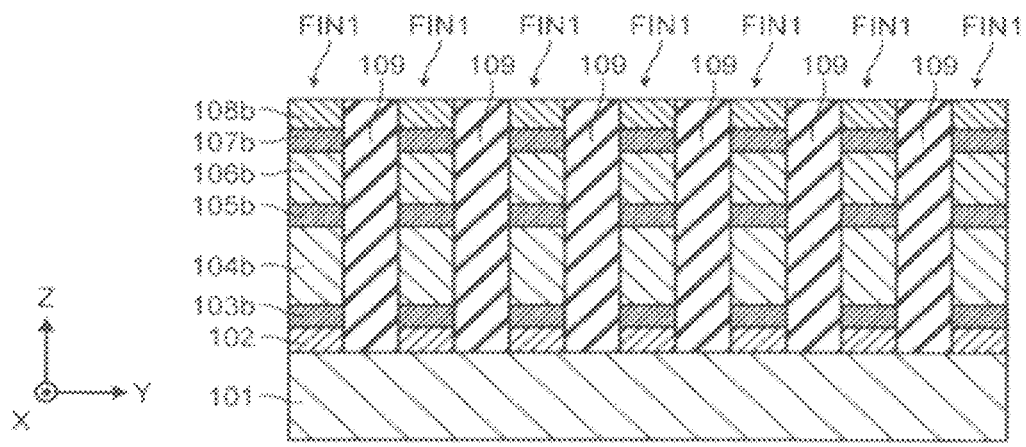

In the step shown in FIG. 3B, the stacked film SF1 is etched into plural fin-like members FIN1 which extend in the direction X and aligned in the direction Y. Thus, the conduction layer 102a is divided into plural line patterns 102 corresponding to the word line WL11 and the like. In each of the fin-like members FIN1, the line pattern 102, a conduction layer 103b, a diode layer 104b, a conduction layer 105b, a resistance change layer 106b, a conduction layer 107b, and a CMP stopper layer 108b are layered in this order (see FIG. 4B).

Next, an interlayer insulation film 109 is embedded between the adjacent fin-like members FIN 1, followed by flattening by CMP. Here, since the CMP stopper layer 108b serves as a stopper, the upper surface is easily flattened.

Figure 4A:
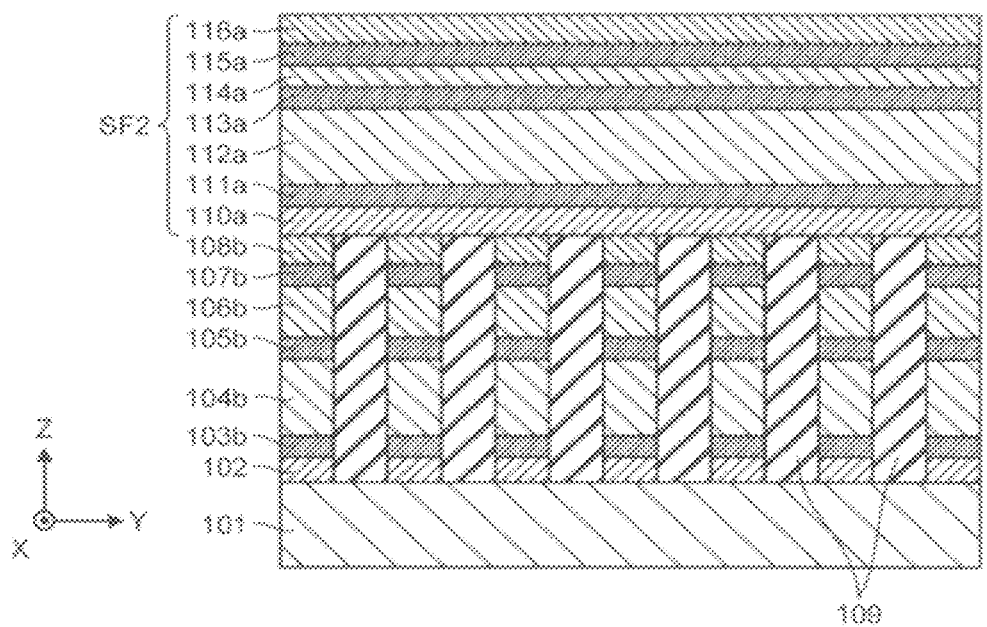
FIGS. 4A and 4B are diagrams showing the method for producing the nonvolatile semiconductor memory device according to the first embodiment.
Figure 4B:
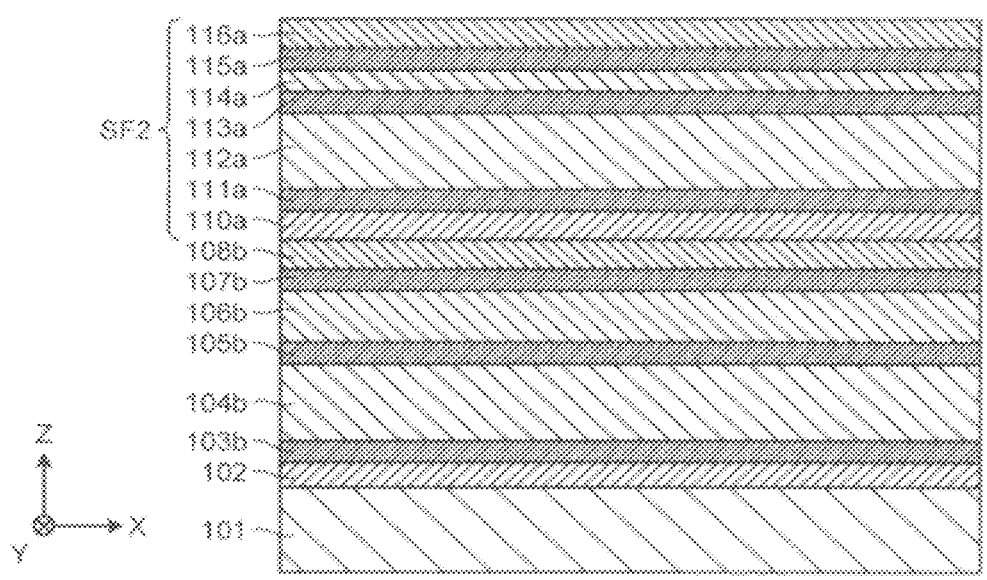

In steps shown in FIGS. 4A and 4B, a stacked film SF2 in which a conduction layer 110a, a conduction layer 111a, a diode layer 112a, a conduction layer 113a, a resistance change layer 114a, a conduction layer 115a, and a CMP stopper layer 116a are layered in this order is formed.

For example, in the case where the diode layer 112a has the PIN structure, P-type impurities are introduced into a semiconductor layer which is to serve as a P-type layer in the diode layer 112a in-situ or after formation, and then a heat treatment for activating the P-type impurities is performed. Also, N-type impurities are introduced into a semiconductor layer which is to serve as an N-type layer in the diode layer 112a in-situ or after formation, and then a heat treatment for activating the N-type impurities is performed.

Figure 5A:
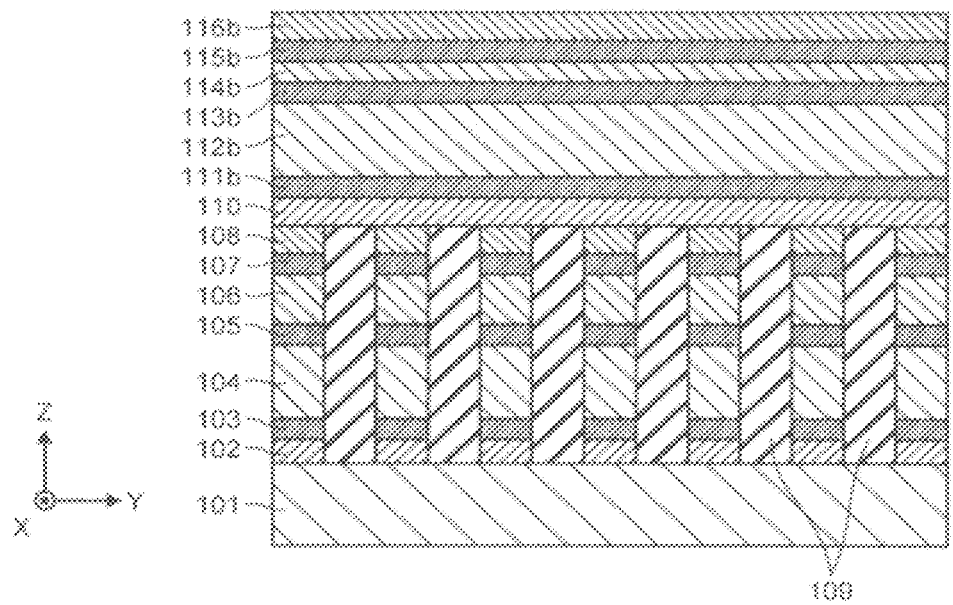
FIGS. 5A and 5B are diagrams showing the method for producing the nonvolatile semiconductor memory device according to the first embodiment.
Figure 5B:
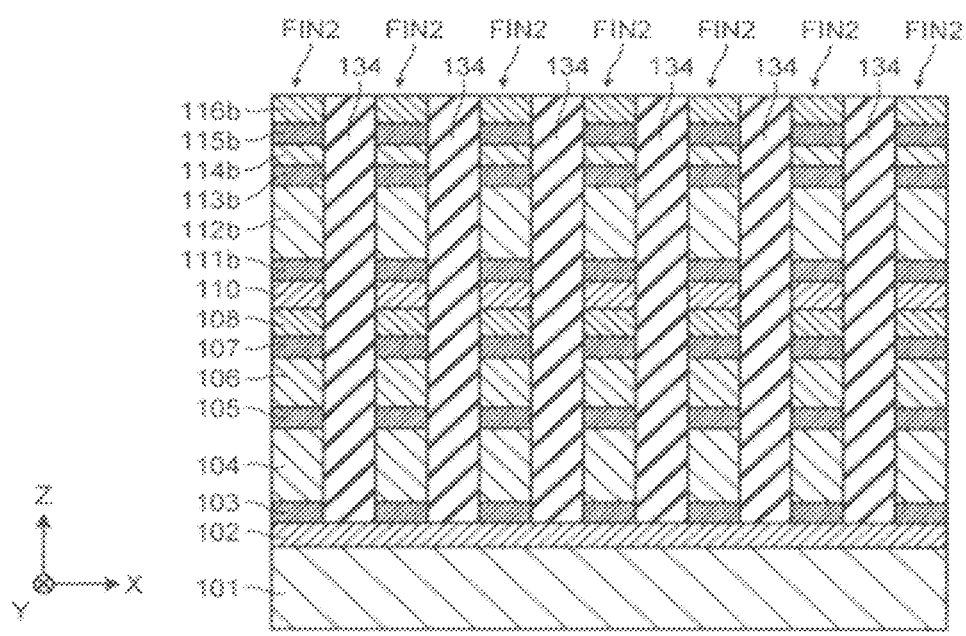

In the step shown in FIGS. 5A and 5B, the stacked film SF2 is etched into plural fin-like members FIN2 which extend in the direction Y and aligned in the direction X. Thus, the conduction layer 110a is divided into plural line patterns 110 in accordance with the bit line BL11 and the like. In each of the fin-like members FIN2, the line pattern 110, a conduction layer 111b, a diode layer 112b, a conduction layer 113b, a resistance change layer 114b, a conduction layer 115b, and a CMP stopper layer 116b are layered in this order.

Simultaneously, the plural lower fin-like members FIN1 are etched into plural memory cells which are two-dimensionally aligned in the direction X and the direction Y. More specifically, a memory cell array in which the plural memory cells MC111 to MC 133 in the lower memory layer MC1 are aligned in a matrix is formed (see FIG. 1A).

Next, an interlayer insulation film 134 is embedded between the adjacent fin-like members FIN2, followed by flattening by CMP. Here, since the CMP stopper layer 116b serves as a stopper, the upper surface is easily flattened.

In the steps shown in FIGS. 2A and 2B, the plural upper fin-like members FIN2 are etched into plural memory cells which are two-dimensionally aligned in the direction X and the direction Y. More specifically, a memory cell array in which the plural memory cells MC211 to MC 233 in the upper memory layer MC2 are aligned in matrix is formed (see FIG. 1A). The above-described steps are repeated to form memory cell arrays for three layers or more.

Also, in order to clarify the effect according to the first embodiment, results of evaluation conducted on a relationship between a film thickness of a resistance change layer and data retention will be described by using FIG. 6.

Figure 6:
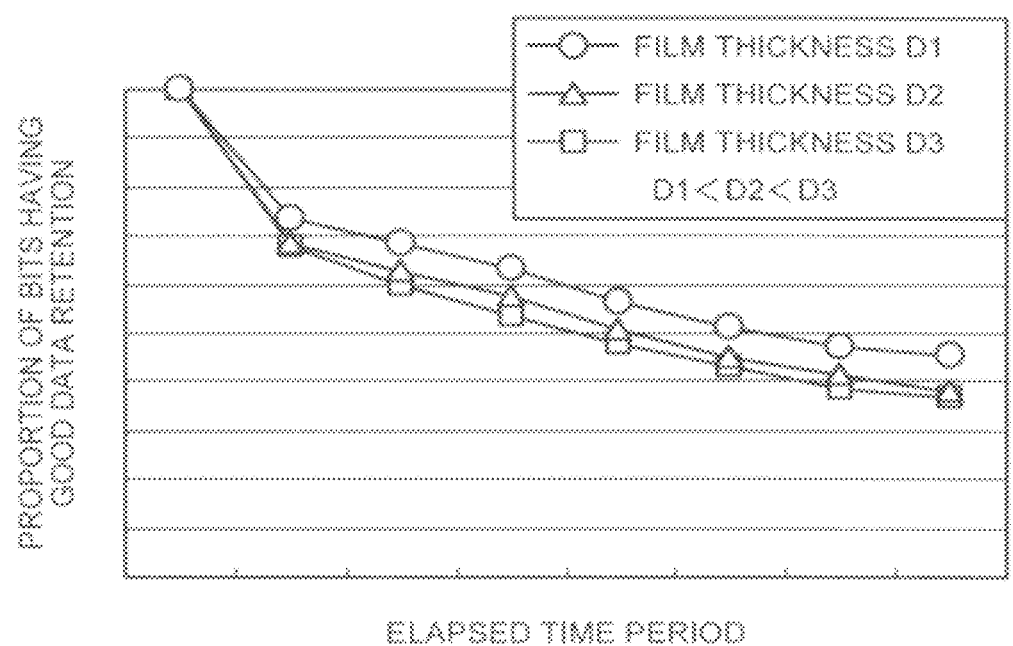
FIG. 6 is a diagram showing a relationship between a film thickness of a resistance change layer and data retention according to the first embodiment.

As shown in FIG. 6, three different memory cell arrays were prepared. More specifically, the three types of memory cell arrays in each of which memory cells including resistance change layers having a film thickness of D1, D2, or D3 were prepared, and data retention after setting (after lowering resistance) was evaluated.

More specifically, the film thicknesses D1, D2, and D3 were decided to satisfy $$D1<D2<D3$$

within a range of 5 to 15 nm. After an elapse of a predetermined time period, a proportion of bits (memory cells) having good data retention was evaluated in each of the memory cell arrays. As a result, it was confirmed that there is a tendency that the proportion of bits having good data retention is increased along with the film thickness increase of D1<D2<D3 of the resistance change layer. From the findings, it was confirmed that a fluctuation in data retention between the upper memory cell and the lower memory cell is reduced when the film thickness $D_{106}$ of the resistance change layer 106 in the lower memory cell MC111 in which the larger number of heating processes is performed is larger than that of the film thickness $D_{114}$ of the resistance change layer 114 in the upper memory cell MC211 in which the smaller number of heating processes is performed.

Hereinafter, as a comparative case, a case in which the film thickness of the resistance change layer of the upper memory cell and the film thickness of the resistance change layer of the lower memory cell are substantially the same will be investigated. In this case, for example, in the above-described production method, the number of heating processes for forming the diode layer is 2 in the memory layer MC2 including the upper memory cell MC211, while the number of heating processes is 4 in the memory layer MC1 including the lower memory cell MC111. Thus, as compared to the resistance change layer of the upper memory cell MC211, the data retention tends to be deteriorated since the resistance change layer of the lower memory cell MC111 is exposed to the larger number of heating processes. Therefore, there is a tendency that a fluctuation in data retention occurs between the upper memory cell and the lower memory cell.

In contrast, in the first embodiment, the film thickness of the resistance change layer in the lower memory cell is increased to be larger than the film thickness of the resistance change layer in the upper memory cell. With such configuration, since the fluctuation in data retention due to the difference in number of heating processes is reduced, it is possible to reduce the fluctuation in data retention between the upper memory cell and the lower memory cell.

It should be noted that, in the nonvolatile semiconductor memory device 100, the film thickness of the resistance change layer of the memory cell in the memory layer MC1 may be thicker than the film thickness of the resistance change layer of the memory cells in the memory layers MC2, MC3, and MC4. Alternatively, the film thicknesses of the resistance change layers of the memory cells of the memory cells MC1 and MC2 may be substantially equal to each other and thicker than the film thicknesses of the memory cells of the memory layers MC3 and MC4. Alternatively, the film thicknesses of the resistance change layers of the memory cells of the memory layers MC1, MC2, and MC3 may be substantially equal to each other and thicker than the film thickness of the resistance change layer of the memory cell in the memory layer MC4.

Alternatively, the film thicknesses of the resistance layers in the nonvolatile semiconductor memory device 100 may be thickened stepwise from the memory layer of the upper layer to the memory layer of the lower layer. For example, in the configuration shown in FIG. 1A, film thickness of resistance layer of memory cell in memory cell MC4<film thickness of resistance layer of memory cell in memory cell MC3<film thickness of resistance layer of memory cell in memory cell MC2<film thickness of resistance layer of memory cell in memory cell MC1 may be satisfied.

Thus, it is possible to reduce in a stepwise manner the fluctuation in data retention which is caused by heat history differences among diode formations in the layers.

(Second Embodiment)

Hereinafter, a nonvolatile semiconductor memory device 100i according to the second embodiment will be described. A feature which is different from the first embodiment will be mainly described in the following.

The second embodiment is different from the first embodiment by the feature that a composition of a resistance change layer of a memory cell in a lower memory layer is different from a composition of a resistance change layer of a memory cell in an upper memory layer.

Figure 7A:
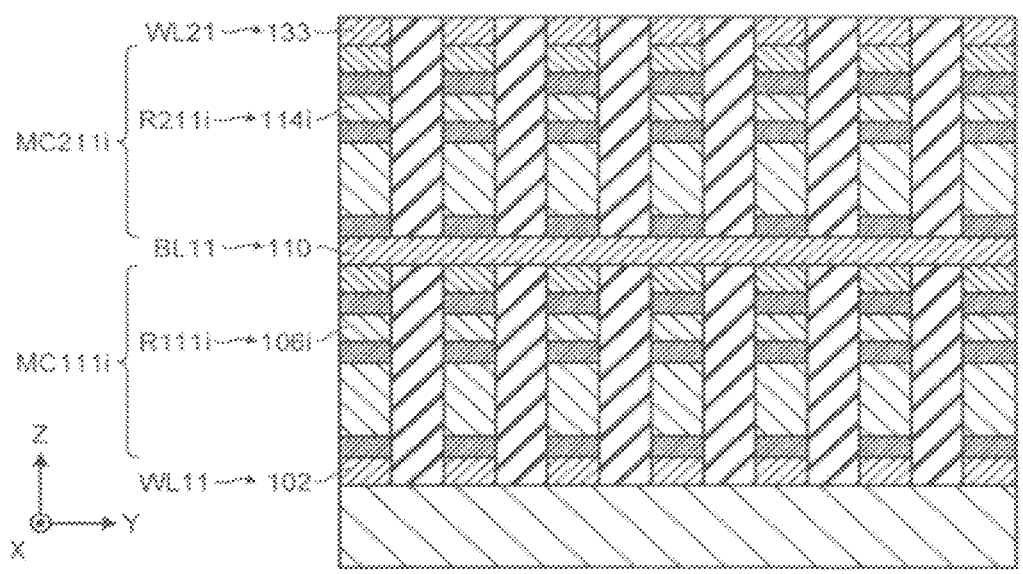
FIGS. 7A and 7B are diagrams showing a configuration of a nonvolatile semiconductor memory device according to a second embodiment.
Figure 7B:
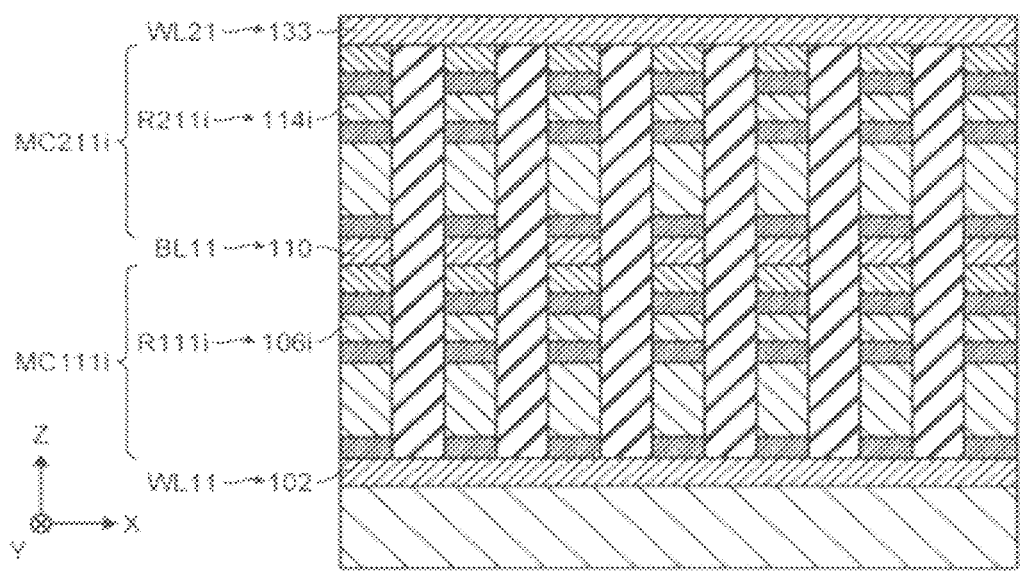

More specifically, as shown in FIGS. 7A and 7B, in the nonvolatile semiconductor memory device 100i, a composition of a resistance change layer 106i which functions as a resistance change element RIM in a lower memory cell MC111i is reduced in degree of deterioration in data retention caused by heat as compared to a resistance change layer 114i which functions as a resistance change element R211i in an upper memory cell MC211i. For example, the resistance change layer 106i of the lower memory cell MC111i is formed from a carbon-based material, and the resistance change layer 114i in the upper memory cell MC211i is made from a metal oxide.

Also, in order to clarify the effect according to the second embodiment, results of evaluation conducted on a relationship between a composition of a resistance change layer and data retention will be described by using FIG. 8.

As shown in FIG. 8, three different memory cell arrays were prepared. More specifically, the three types of memory cell arrays in each of which plural memory cells including resistance change layers of a metal oxide, a first carbon-based material, or a second carbon-based material were prepared, and data retention after setting (after lowering resistance) was evaluated.

More specifically, probability distribution of a current Iset after setting (after lowering resistance) and a current Ireset after resetting (after increasing resistance) was obtained after a predetermined time had passed, and a value at which Iset and Ireset intersect with each other was detected. The results are shown in FIG. 8. The results in FIG. 8 indicate that the larger the value is, the better the data retention becomes. More specifically, it was confirmed that there is a tendency that a proportion of bits having good data retention is increased along with the change of the composition of the resistance change layer of metal oxide→first carbon-based material→second carbon based material. From the findings, it was confirmed that the fluctuation in data retention between the upper memory cell and the lower memory cell is reduced by forming the resistance change layer 106i in the lower memory cell MC111i to which the larger number of heating processes is performed by using the carbon-based material and forming the resistance change layer 114i in the upper memory cell MC211i to which the smaller number of heating processes is performed by using the metal oxide.

The metal oxide is a material containing at least one selected from the group consisting of $ZnMn_2O_4$, NiO, HfO, $TiO_2$, $SrZrO_3$, and $Pr_{0.7}Ca_{0.3}MnO_3$ as a main component, for example. The first carbon-based material is a material containing SiC as a main component, for example. The second carbon-based material is a material containing a C nanotube as a main component, for example.

As described above, in the second embodiment, the composition of the resistance change layer in the lower memory cell has a smaller degree of deterioration in data retention due to heat than that of the composition of the resistance change layer in the upper memory cell. With such configuration, it is possible to reduce the fluctuation in data retention between the upper memory cell and the lower memory cell by reducing the fluctuation in data retention which is otherwise caused by the difference in number of heating processes.

For example, the resistance change layer in the lower memory cell is formed from the carbon-based material, and the resistance change layer in the upper memory cell is formed from the metal oxide. With such configuration, the degree of deterioration in data retention due to heat of the composition of the resistance change layer in the lower memory cell is smaller than that of the composition of the resistance change layer in the upper memory cell.

In the nonvolatile semiconductor memory device 100i, the compositions of the resistance change layers may be changed stepwise from the upper memory layer to the lower memory layer. For example, in the configuration shown in FIG. 1A, the resistance change layers of the memory cells in the memory layers MC3 and MC4 may be formed from the metal oxide; the resistance change layers of the memory cells in the memory layer MC2 may be formed from the first carbon-based material; and the resistance change layers of the memory cells in the memory layer MC1 may be formed from the second carbon-based material.

With such configuration, it is possible to reduce in the stepwise manner the fluctuation in data retention due to heat history differences among diode formations in the layers.

Alternatively, the first embodiment and the second embodiment may be combined. More specifically, a film thickness of the resistance layer in the lower memory cell is increased to be larger than a film thickness of the resistance change layer in the upper memory cell, and the composition having the smaller degree of deterioration in data retention due to heat than that of the composition of the resistance change layer in the upper memory cell is used for the resistance change layer in the lower memory cell.

(Third Embodiment)

Hereinafter, a nonvolatile semiconductor memory device 100j according to the third embodiment will be described. A feature which is different from the first embodiment will be mainly described in the following.

The third embodiment is different from the first embodiment by the feature that a width in a planar direction of a resistance change layer of a memory cell in a lower memory layer is wider than a width in a planar direction of a resistance change layer of a memory cell in an upper memory layer.

More specifically, the nonvolatile semiconductor memory device 100j is obtainable by modifications of adding an insulation film 192 (see FIGS. 10A and 10B) between a wiring layer BL1 and a wiring layer WL2 by eliminating a memory layer MC2 and widening a line width of word lines in the wiring layer WL1 and bit lines in the wiring layer BL1.

For example, as shown in FIGS. 9A and 9B, a line width W1 of word lines WL11j, WL12j in a wiring layer WL1j is wider than a line width W3 of word lines WL21j to WL24j in a wiring layer WL2j. The line width W1 may be equivalent to a sum of a value which is a double of the line width W3 and a space between the word lines WL21j and WL22j. Also, a line width W2 of bit lines BL11j, BL12j in a wiring layer BL1j is wider than a line width W4 of bit lines BL21j to BL24j in wiring layer BL2j. The line width W2 may be equivalent to a sum of a value which is a double of the line width W4 and a space between the bit lines BL21i and BL22j.

Accordingly, a width in a planar direction of a lower memory cell MC111j (see FIG. 9B) positioned on an intersection between the word line WL11j and the bit line BL11j is wider than a width in a planar direction of an upper memory cell MC311j (see FIG. 9A) positioned on an intersection between the word line WL21j and the bit line BL21j.

Figure 10A:
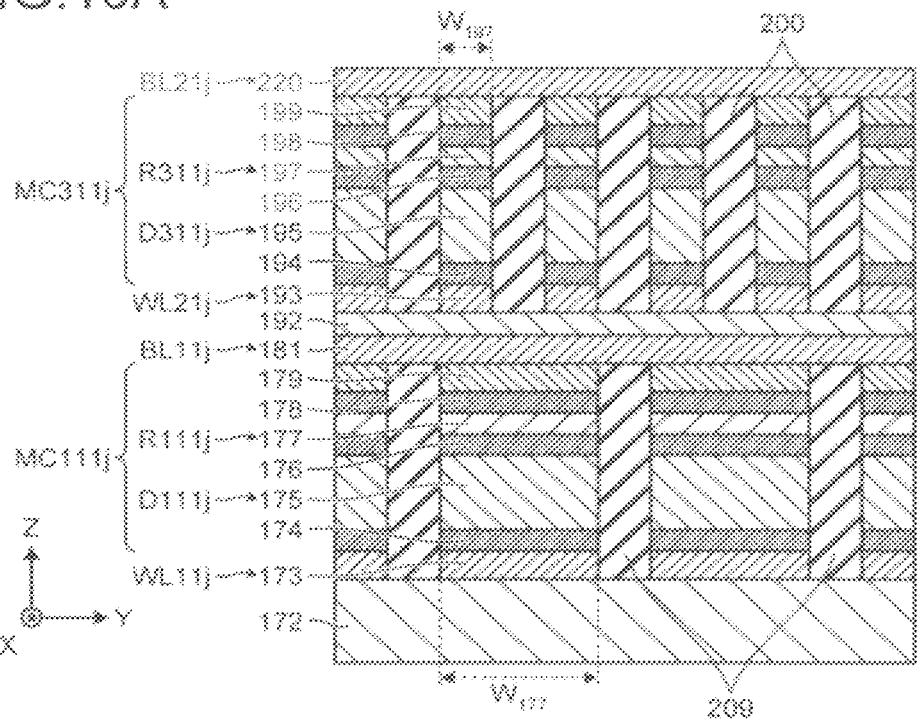
FIGS. 10A and 10B are diagrams showing the configuration of the nonvolatile semiconductor memory device according to the third embodiment.
Figure 10B:
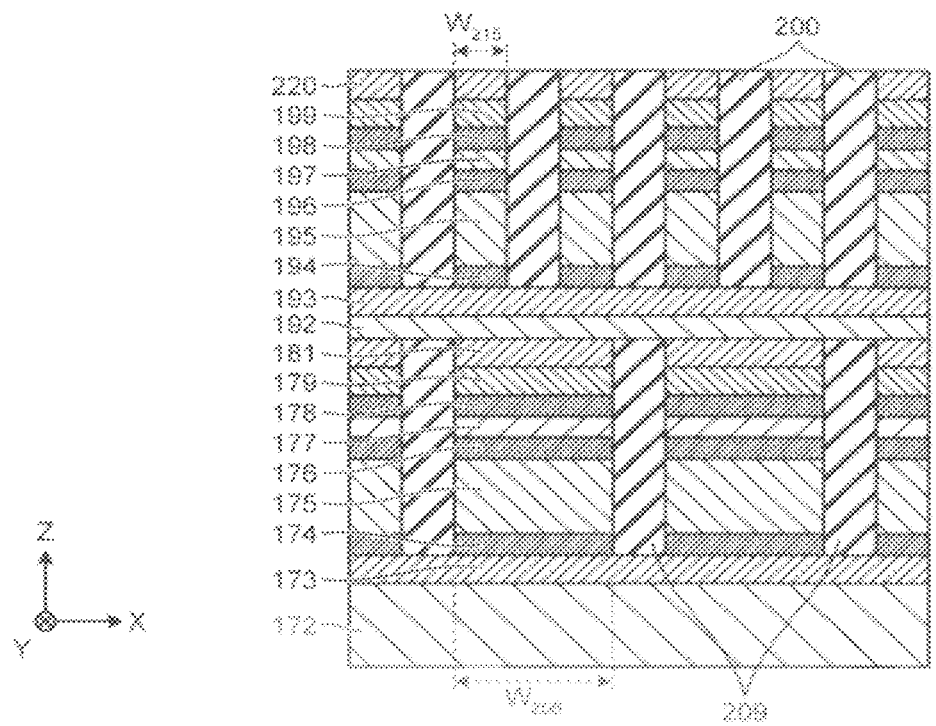

More specifically, as shown in FIGS. 10A and 10B, in the memory cell MC111j, each of a barrier metal layer 174, a diode layer (rectification layer) 175, a lower electrode layer 176, a resistance change layer 177, an upper electrode layer 178, and a CMP stopper layer 179 a lower memory cell MC111 shown in FIG. 1B has a width corresponding to the line width W1 of a line pattern 173 corresponding to the word line WL11j and a width corresponding to the line width W2 of a line pattern 181 corresponding to the bit line BL11j as shown in FIGS. 2A and 2B. For example, the resistance change layer 177 has a width W177 in the direction Y corresponding to the line width W1 and a width W206 in the direction X corresponding to the line width W2. The diode layer 175 functions as a rectification element D111j, and the resistance change layer 177 functions as a resistance change element R111j.

In contrast, in the upper memory cell MC311j, each of a barrier metal layer 194, a diode layer (rectification layer) 195, a lower electrode layer 196, a resistance change layer 197, an upper electrode layer 198, and a CMP stopper layer 199 has a width corresponding to the line width W1 of a line pattern 193 corresponding to the word line WL21j and a width corresponding to the line width W2 of a line pattern 220 corresponding to the bit line BL21j. For example, the resistance change layer 197 has a line width W197 in the direction Y corresponding to the line width W3 and a width W215 in the direction X corresponding to the line width W4. The diode layer 195 functions as a rectification element D311j, and the resistance change layer 197 functions as a resistance change element R311j.

The width W177 in the direction Y of the resistance change layer 177 in the lower memory cell MC111j is wider than the width W197 in the direction Y of the resistance change layer 197 in the memory cell MC311j. Also, the width W206 in the direction X of the resistance change layer 177 in the lower memory cell MC111j is wider than the width W215 in the direction X of the resistance change layer 197 in the upper memory cell MC311j.

The upper memory cell MC311j and the lower memory cell MC111j are disposed on an underlying region 172.

A method for producing the nonvolatile semiconductor memory device 100j is different from the first embodiment as shown in FIGS. 11, 12, and 10.

In the step shown in FIG. 3B, an etching processing is performed in such a manner as to etch with a width of plural fin-like members FIN1 in accordance with the line width W1. Other features are the same as the first embodiment.

Figure 11A:
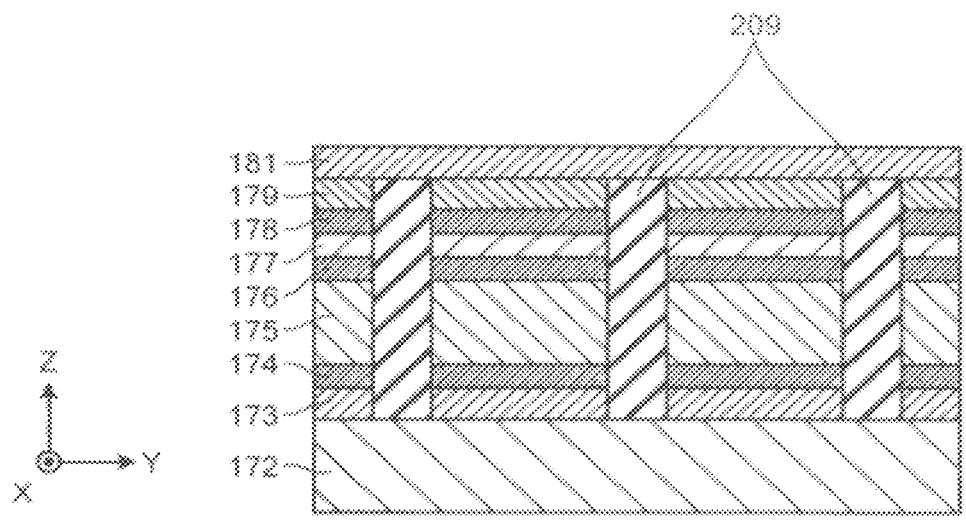
FIGS. 11A and 11B are diagrams showing a method for producing the nonvolatile semiconductor memory device according to the third embodiment.
Figure 11B:
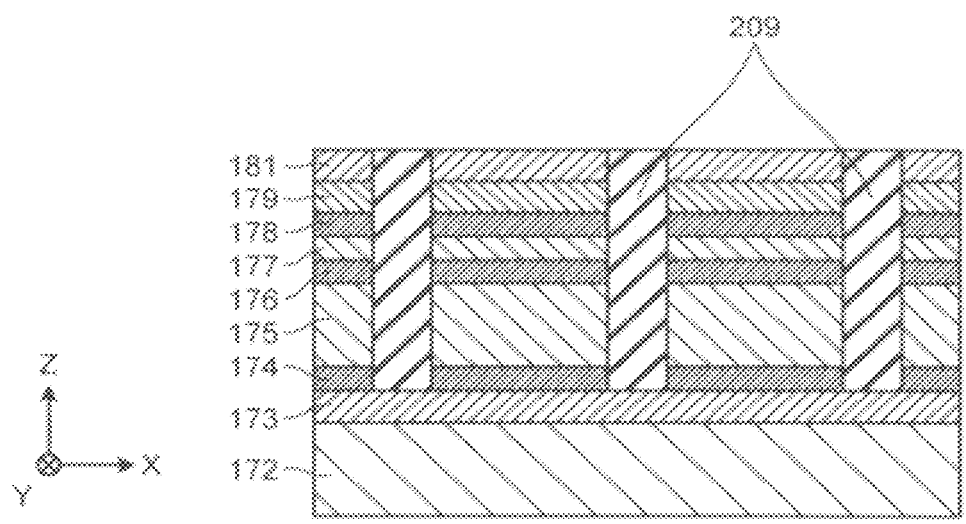

In the step shown in FIGS. 11A and 11B, a conduction layer (not shown) is deposited on the plural fin-like members FIN1. After that, the conduction layer and the plural fin-like members are subjected to the etching. Thus, the conduction layer is divided into plural line patterns 181 corresponding to the bit line BL11j and the like. Simultaneously, the plural fin-like members FIN1 are divided into plural memory cells which are two-dimensionally aligned in the direction X and the direction Y. More specifically, a memory cell array in which plural memory cells MC111j to MC122j are aligned in matrix in a lower memory layer MC1j is formed (see FIG. 9B). After that, an interlayer insulation film 209 is embedded between the adjacent memory cells of MC111j to MC122j.

Figure 12A:
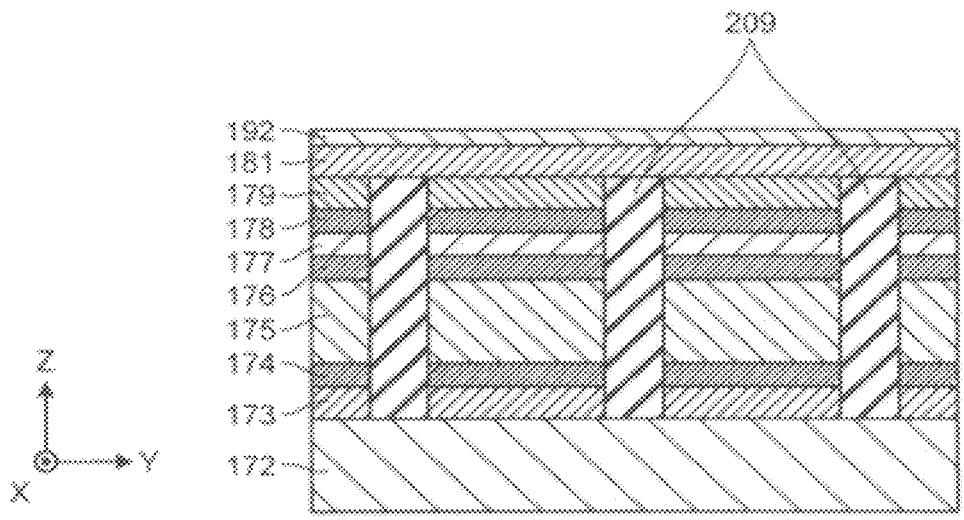
FIGS. 12A and 12B are diagrams showing a method for producing the nonvolatile semiconductor memory device according to the third embodiment.
Figure 12B:
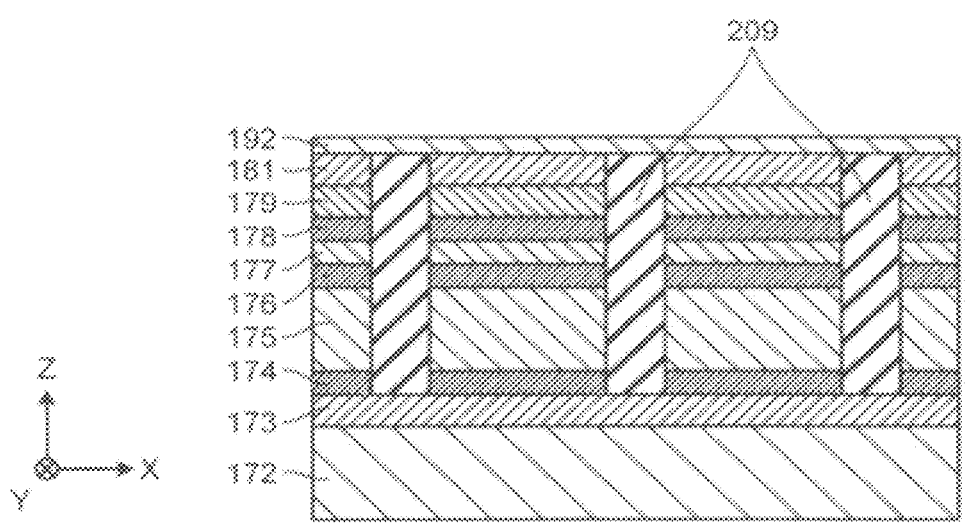

In the step shown in FIGS. 12A and 12B, an insulation film 192 covering the plural line patterns 181 and the interlayer insulation film 209 is formed.

In the step shown in FIGS. 10A and 10B, a multilayer film shown in FIG. 3A is formed on the insulation film, and the multilayer film is subjected to an etching processing in similar manner to a manner described above to form plural memory cells each having a large width corresponding to the line widths W3 and W4. More specifically, a memory array in which plural memory cells MC311j to MC344j are aligned in matrix in an upper memory layer MC3j is formed (see FIG. 9A). Simultaneously, plural line patterns 220 corresponding to the bit lines BL21j and the like are formed. After that, an interlayer insulation film 200 is embedded between the adjacent memory cells of MC311j to MC344j.

In order to clarify the effect according to the third embodiment, results of evaluation conducted on a relationship between a cell size (width in planar direction of resistance change layer) and data retention will be described by using FIGS. 13A and 13B.

Figure 13A:
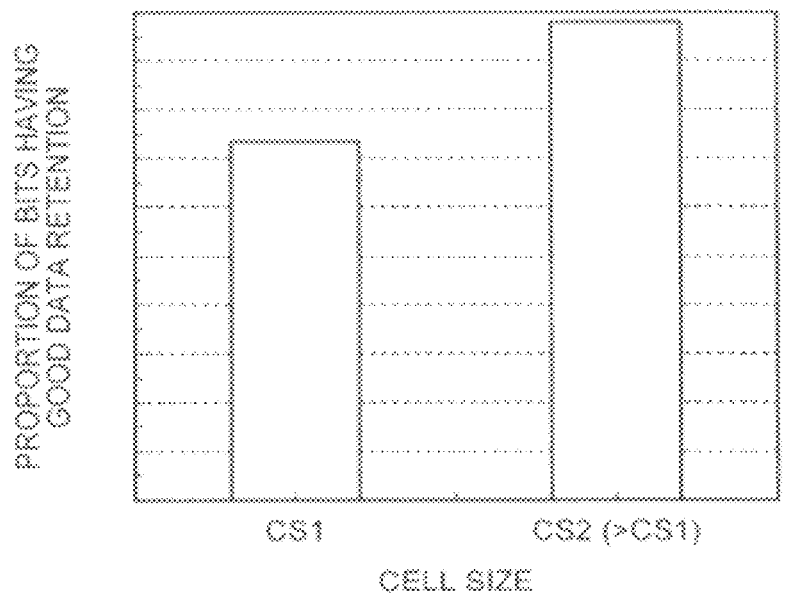
FIGS. 13A and 13B are diagrams showing a relationship between a cell size (a width of a resistance change layer) and data retention.
Figure 13B:
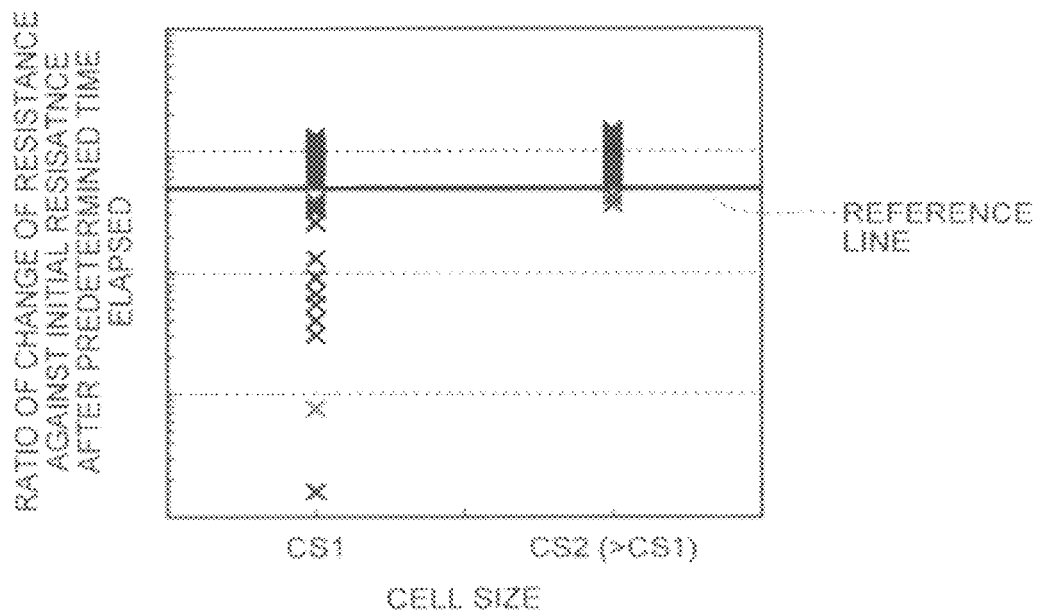

As shown in FIG. 13A, two different memory arrays were prepared. More specifically, the two memory arrays in each of which plural memory cells having a cell size CS1 or CS2 are aligned were prepared, and data retention after setting (after lowering resistance) was evaluated.

More specifically, the cell size was decided so as to satisfy: CS2=CS1×6. After an elapse of a predetermined time period, a proportion of bits (memory cells) having good data retention was evaluated in each of the memory cell arrays. As a reference for deciding whether or not the data retention was good, a resistance change ratio of 50% or more was used. More specifically, as shown in FIG. 13B, the bits distributed below the reference line were decided to be NG. As a result, it was confirmed that there is a tendency that a proportion of bits having good data retention is increased along with an increase in cell size of CS1→CS2. From the findings, it was confirmed that the fluctuation in data retention between the upper memory cell and the lower memory cell is reduced when the width in planar direction of the resistance change layer 177 in the lower memory cell MC111$j$ for which the larger number of heating processes is performed is larger than the width in planar direction of the resistance change layer 197 in the upper memory cell MC311$j$ for which the smaller number of heating processes is performed.

As described above, in the third embodiment, the width in the planar direction of the resistance change layer in the lower memory cell is wider than the width in the planar direction of the resistance change layer in the upper memory cell. With such configuration, it is possible to reduce the fluctuation in data retention between the upper memory cell and the lower memory cell by reducing the fluctuation in data retention due to the difference in number of heating processes.

In the nonvolatile semiconductor memory device 100$j$, the cell size (width in planar direction of resistance change layer) may be increased (widened) stepwise from the upper memory layer to the lower memory layer. For example, in the configuration shown in FIG. 1A, cell size of memory cell in memory layer MC4<cell size of memory cell in memory layer MC3<cell size of memory cell in memory layer MC2<cell size of memory cell in memory layer MC1 may be satisfied.

With such configuration, it is possible to reduce in the stepwise manner the fluctuation in data retention due to heat history differences among diode formations in the layers.

Alternatively, the first embodiment and the third embodiment may be combined. More specifically, a film thickness of the resistance layer in the lower memory cell is increased to be larger than a film thickness of the resistance change layer in the upper memory cell, and the width in the planar direction of the resistance change layer in the lower memory cell is widened to be larger than the width in the planar direction of the resistance change layer in the upper memory cell.

Alternatively, the second embodiment and the third embodiment may be combined. More specifically, the composition of the resistance change layer in the lower memory cell has a smaller degree of deterioration in data retention due to heat than that of the composition of the resistance change layer in the upper memory cell, and the width in the planar direction of the resistance change layer in the lower memory cell is widened to be larger than the width in the planar direction of the resistance change layer in the upper memory cell.

Alternatively, all of the first to the third embodiments may be combined.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate;
   a first line disposed above the semiconductor substrate;
   a first memory cell disposed on a side opposite to the semiconductor substrate with respect to the first line;
   a second line intersecting with the first line via the first memory cell;
   a second memory cell disposed on a side opposite to the semiconductor substrate with respect to the second line; and
   a third line intersecting with the second line via the second memory cell, wherein the first memory cell has a first resistance change layer and a first rectification layer,
   the second memory cell has a second resistance change layer and a second rectification layer, and
   a composition of the first resistance change layer is different from a composition of the second resistance change layer, wherein
   the first resistance change layer is formed of a first carbon-based material, and the second resistance change layer is formed of a metal oxide.

2. The nonvolatile semiconductor memory device according to claim 1, wherein
   the first carbon-based material comprises a material containing SiC as a main component or a material containing a carbon nanotube as a main component, and
   the metal oxide comprises a material containing, as a main component, at least one selected from a group consisting of $ZnMn_2O_4$, NiO, HfO, $TiO_2$, $SrZrO_3$, and $Pr_{0.7}Ca_{0.3}MnO_3$.

3. The nonvolatile semiconductor memory device according to claim 1, further comprising:
   a third memory cell disposed between the semiconductor substrate and the first line; and
   a fourth line disposed between the semiconductor substrate and the third memory cell, the fourth line intersecting with the first line via the third memory cell, wherein
   the third memory cell has a third resistance change layer and a third rectification layer, and
   wherein
   the third resistance change layer is formed from a second carbon-based material.

4. The nonvolatile semiconductor memory device according to claim 3, wherein
   the second carbon-based material comprises a material containing a carbon nanotube as a main component,
   the first carbon-based material comprises a material containing SiC as a main component, and
   the metal oxide comprises a material containing, as a main component, at least one selected from the group consisting of $ZnMn_2O_4$, NiO, HfO, $TiO_2$, $SrZrO_3$, and $Pr_{0.7}Ca_{0.3}MnO_3$.

5. A nonvolatile semiconductor memory device comprising:
  a semiconductor substrate;
  a first line disposed on the semiconductor substrate;
  a first memory cell disposed on a side opposite to the semiconductor substrate with respect to the first line;
  a second line intersecting with the first line via the first memory cell;
  a second memory cell disposed on a side opposite to the semiconductor substrate with respect to the second line; and
  a third line intersecting with the second line via the second memory cell, wherein
  the first memory cell has a first resistance change layer and a first rectification layer,
  the second memory cell has a second resistance change layer and a second rectification layer, and
  a film thickness of the first resistance change layer is larger than a film thickness of the second resistance change layer.

6. The nonvolatile semiconductor memory device according to claim 5, further comprising:
  a third memory cell disposed on a side opposite to the semiconductor substrate with respect to the third line; and
  a fourth line intersecting with the third line via the third memory cell, wherein
  the third memory cell has a third resistance change layer and a third rectification layer, and
  a film thickness of the second resistance change layer is larger than a film thickness of the third resistance change layer.

7. A nonvolatile semiconductor memory device comprising:
  a semiconductor substrate;
  a first line disposed on the semiconductor substrate;
  a first memory cell disposed on a side opposite to the semiconductor substrate with respect to the first line;
  a second line intersecting with the first line via the first memory cell;
  a third line disposed on a side opposite to the semiconductor substrate with respect to the second line;
  a second memory cell disposed on a side opposite to the semiconductor substrate with respect to the third line;
  a fourth line intersecting with the third line via the second memory cell; and
  an insulation film insulating the second line and the third line from each other, wherein
  the first memory cell has a first resistance change layer and a first rectification layer,
  the second memory cell has a second resistance change layer and a second rectification layer,
  a width of the first resistance change layer in a planar direction which is parallel to a surface of the semiconductor substrate is larger than a width of the second resistance change layer in a planar direction which is parallel to the surface of the semiconductor substrate, and
  a width of each of the first line and the second line is larger than a width of each of the third line and the fourth line.

8. The nonvolatile semiconductor memory device according to claim 7, further comprising:
  a fifth line disposed adjacent to the third line via an interlayer insulation film on a side opposite to the semiconductor substrate with respect to the second line;
  a third memory cell disposed adjacent to the second memory cell via the interlayer insulation film on a side reverse to the semiconductor substrate with respect to the fifth line; and
  a sixth line intersecting with the fifth line via the third memory cell, wherein
  a width of each of the first line and the second line is equivalent to a sum of the width of each of the third line and the fourth line, a width of each of the fifth line and the sixth line, and a space between the third line and the fifth line.

9. The nonvolatile semiconductor memory device according to claim 8, wherein
  the third memory cell has a third resistance change layer and a third rectification layer; and
  a width of the second resistance change layer in a planar direction which is parallel to the surface of the semiconductor substrate is equivalent to a width of the third resistance change layer in a planar direction which is parallel to the surface of the semiconductor substrate.

10. The nonvolatile semiconductor memory device according to claim 7, wherein
  a film thickness of the first resistance change layer is larger than a film thickness of the second resistance change layer.

11. The nonvolatile semiconductor memory device according to claim 10, wherein
  a composition of the first resistance change layer is different from a composition of the second resistance change layer.

* * * * *